United States Patent [19]

Sarnezki et al.

[11] Patent Number: 4,616,291
[45] Date of Patent: Oct. 7, 1986

[54] ELECTRONIC DEVICE WITH DENSELY PACKED COMPONENTS

[75] Inventors: Herbert Sarnezki; Torsten Schlemmer, both of Munich, Fed. Rep. of Germany

[73] Assignee: Siemens Aktiengesellschaft, Berlin and Munich, Fed. Rep. of Germany

[21] Appl. No.: 805,980

[22] Filed: Dec. 5, 1985

Related U.S. Application Data

[63] Continuation-in-part of Ser. No. 514,189, Jul. 15, 1983, abandoned.

[30] Foreign Application Priority Data

Jul. 19, 1982 [DE] Fed. Rep. of Germany ....... 3226972

[51] Int. Cl.⁴ .............................................. H05K 5/02
[52] U.S. Cl. ............................... 361/398; 340/815.14; 340/815.17; 361/394; 361/395; 361/399; 362/26; 362/28; 362/29; 362/362; 364/424; 364/708
[58] Field of Search .............. 361/398, 399, 394, 395, 361/415; 340/815.14, 815.17; 362/23, 26, 29, 85, 291, 362, 28; 364/424, 708

[56] References Cited

U.S. PATENT DOCUMENTS

| | | | |
|---|---|---|---|
| 3,827,056 | 7/1974 | Vano | 361/398 X |
| 3,873,889 | 3/1975 | Leyba et al. | 361/398 X |
| 3,971,127 | 7/1976 | Gigure et al. | 361/398 X |
| 4,191,441 | 3/1980 | Ryder et al. | 361/398 X |
| 4,296,457 | 10/1981 | Hahlganss | 361/398 X |
| 4,360,858 | 11/1982 | Fahling | 361/398 X |
| 4,555,694 | 11/1985 | Yanagishima et al. | 362/26 X |

FOREIGN PATENT DOCUMENTS

| | | | |
|---|---|---|---|
| 2808997 | 9/1979 | Fed. Rep. of Germany | 361/395 |
| 145361 | 12/1980 | Fed. Rep. of Germany | 361/398 |

Primary Examiner—R. R. Kucia
Attorney, Agent, or Firm—Herbert L. Lerner; Laurence A. Greenberg

[57] ABSTRACT

An electronic device with densely packed components includes a bipartite housing, a film circuit guided meander-like in said housing, at least one reinforcement plate for reinforcing said film circuit over part of the length of said film circuit, means integral with at least one part of said housing for fixing said reinforcement plate in position, an illuminated display disposed in said housing for viewing said film circuit, and a calibration potentiometer disposed in said housing for contacting said film circuit.

15 Claims, 6 Drawing Figures

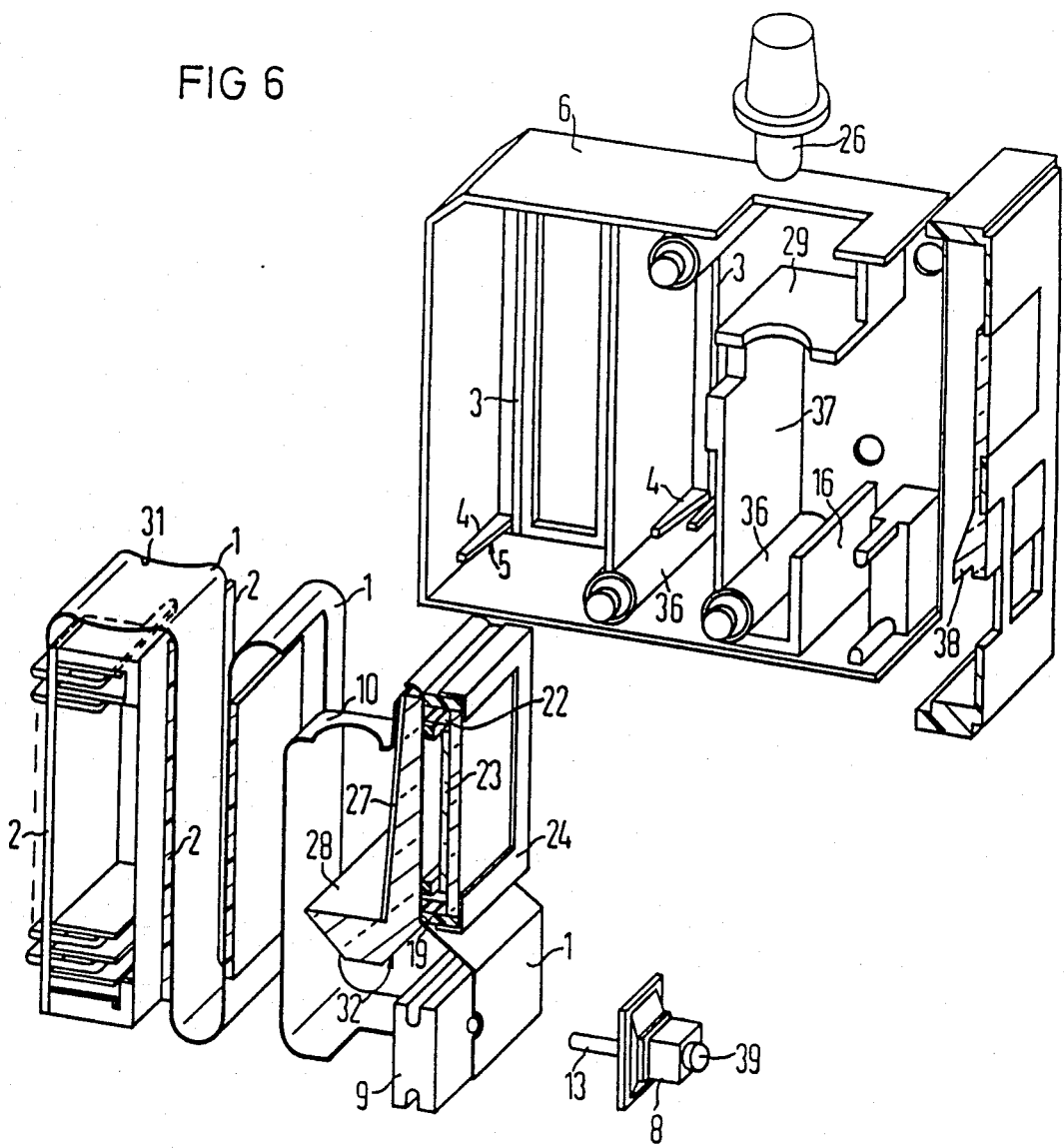

ELECTRONIC DEVICE WITH DENSELY PACKED COMPONENTS

This is a Continuation-in-Part of Application Ser. No. 514,189, filed July 15, 1983, now abandoned.

The invention relates to an electronic device with densely packed components, especially a dashboard computer for motor vehicles, including a film circuit, and illuminated display, a calibrating potentiometer, and a housing.

Dashboard computers of this type perform a number of functions in a motor vehicle, such as the indication of various performance states of the motor, indication of the fuel level in the fuel tank, and the like.

Dashboard computers of this type must occupy as little space as possible, because they are mounted in the instrument panel, where there is usually very little space available.

Furthermore, they must be shock and vibration resistant, to be capable of operating under the requirements and loads which exist during the operation of the vehicle.

The use of conventional film circuits may in and of itself result in a highly dense packing of the components. However, their use does not achieve the required strength, if a simple assembly procedure is also a construction requirement.

Therefore, in practice, printed circuit board technology is still in use, though this technology does not result in a sufficiently compact construction, because it requires too much space. It is accordingly an object of the invention to provide an electronic device with densely packed components, which overcomes the hereinafore-mentioned disadvantages of the hertofore-known devices of this general type, to achieve a greater packaging density of the components, and therefore to reduce the dimensions of the device itself.

With the foregoing and other objects in view there is provided, in accordance with the invention, an electronic device with densely packed components, comprising a bipartite housing, a film circuit (such as an integrated circuit) guided meander-like in the housing, at least one reinforcement plate for reinforcing the film circuit over part of the length of the film circuit, means integral with at least one part of the housing for fixing the reinforcement plate in position, an illuminated display disposed in the housing and a calibration potentiometer disposed in the housing for contacting the film circuit.

In this context, the term "film circuit" is understood to mean a printed circuit with components on a flexible film. The film should be bendable with a bending radius of only about 0.5 mm, without damage to the film or the circuit and components thereon.

A reinforcement plate is required for absorbing mechanical loads and is also advantageous for the automatic installation of components into the circuit. However, the reinforcement plate must not extend to the bending points of the meander-shaped foil, because this would prevent the formation of bends with a small bending radius. On the other hand, the reinforcement plate is too heavy to be carried by the film. Therefore, in accordance with another feature of the invention, the fixing means are guides and/or holders for the reinforcement plates.

In accordance with a further feature of the invention, the reinforcement plate has edges extended laterally beyond the film circuit, and the housing has walls with guide slots formed therein forming the fixing means in which the edges of the reinforcement plate are disposed. If these slots are not much longer than the length of the edges of the reinforcement plates, they simultaneously serve as holding elements, because they hold the film circuit in a fixed position.

If compensation for variations in length is required, it is advantageous, when using several holding plates, to make some of the guide slots longer than the edges of the respective holding plate, so that the holding plate can move in the guide slot.

In accordance with an added feature of the invention, both parts of the housing have the slots formed therein, defining edges of the slots, and including insertion ribs disposed on the housing walls and projecting from the edges of the slots to ends of the ribs, the ribs having continuous guide surfaces being spaced further apart from each other at the ends of the ribs than at the edges of the slots, i.e. with increasing distance from the edges of the guide slots, the guide surfaces are increasingly distant from the axis of symmetry of the slots. These insertion ribs may be positioned at any location along the film circuit, as long as they do not spatially interfere with any components on the film circuit. The electrically conducting paths on the film circuit are not affected or damaged thereby, because the guide slots only grip the reinforcement plates, and the guide surfaces slant away from the reinforcement plates starting from the bottom of the guide slot. Only the edge of the film circuit should be in contact with the insertion surfaces.

It is advantageous for the reliable wiring and assembly of the device, if all electrical components in the device can be connected through the film circuit, even those that are solidly mounted outside the film circuit. Therefore, in accordance with an additional feature of the invention, the film circuit has lugs, flaps or straps formed thereon being folded out as permanent wiring for contacting and connecting electrical terminals of electrical components disposed outside of the film circuit, to the film circuit.

The described construction allows the front plate to be made as small as the operating and indicating elements thereon will permit. Therefore, according to the invention, the space requirement for the operating and indicating elements is reduced as much as possible. In accordance with again another feature of the invention, the calibration potentiometer includes an adjustment element for setting the potentiometer and a key disposed toward the outside of the housing for operating the potentiometer, the key having a hole formed therein providing access to the adjustment element. In this manner, the calibration of the instrument can be performed in the assembled condition through the hole in the operating key from the front. Another advantage of this construction is that the actually existing danger of theft in the workshop is avoided, because the electronic device need not be removed from the vehicle for calibration. This is a special advantage in the case of the calibration of a fuel gauge for the gasoline tank of a motor vehicle.

In accordance with again a further feature of the invention, there is provided a plug closing the hole and projecting beyond the key. After the calibration, the hole should be closed by a plug made of rubber or plastic. The plug may also serve at the same time for locating a special operating key by touch in the dark.

In accordance with again an added feature of the invention, the film circuit has flaps formed thereon being folded out as contacts, and the potentiometer has an adjusting slot formed through the potentiometer forming the adjustment element, and including an adjustment shaft supported in at least one part of the housing and having a shaped part inserted in the adjusting slot, the potentiometer being fixed in position by the adjustment shaft and the film circuit or one of the flaps of the film circuit.

In accordance with again an additional feature of the invention, there is provided a bearing box formed of two assembled parts each being molded into a respective outer wall part of the housing, the adjustment shaft being disposed in a recess formed in the bearing box in axial direction of the adjustment shaft and the adjustment shaft having a depression formed therein coaxial to the recess and open to the outside of the housing, the shaft having walls being pressed into the recess in vicinity of the depression for locking in a value set in the potentiometer.

An adjustment shaft constructed in this way, on one hand fixes the position of the calibration potentiometer while the film circuit only assures that the potentiometer cannot rotate, and on the other hand it also locks in the calibration value. This latter function is simply achieved by the feature that the adjustment shaft is made of a material which melts at about 100° C., and that the shaft is expanded by heating it, such as with a soldering iron. The operating key is therefore formed, at least in vicinity of the hole, of a plastic which melts at a higher temperature, such as silicone rubber which melts above 200° C.

In accordance with yet another feature of the invention, there is provided a light conductor disposed in the housing with a light outlet surface disposed behind the display, the light conductor having bordering surfaces inclined relative to each other in vicinity of the display, and the light conductor having another bordering surface extending parallel to the display.

In accordance with yet a further feature of the invention, there is provided a lamp disposed in the housing behind the light conductor, as seen from the display, and an opaque covering disposed on the side of the light conductor facing the lamp, the covering having a strongly reflective surface facing toward the light conductor, the light conductor having a light entry surface with a light inlet formed therein substantially perpendicular to the display, and the light conductor having two reflective surfaces disposed at an angle relative to the light entry surface for reflecting a portion of light emitted from the lamp onto the strongly reflective surface of the covering.

The construction and disposition of the display, its holding elements and their illumination by a light conductor, are also special features, carried out with the idea of saving space. Although the reflecting surfaces in the light conductor are dimensioned and disposed in such a way that the greater part of the light is conducted onto the strongly reflecting surface, part of the light also escapes through the reflecting surfaces of the light conductor due to the spatial disposition of the light source, and in this manner illuminates the indicating fields or dials on the front of the panel, which are disposed in the direction of the transmitted light.

In accordance with a concomitant feature of the invention, there are provided conducting rubber strips contating the display, a holding frame having fixed holding ledges and a resilient holding ledge securing the conducting strips, and a metal frame, the display and a portion of the film circuit for connection to the display being fastened to the light conductor by the metal frame and being fixed in position by pressure against the conducting rubber strips.

The elastic holding ledge in the holding frame for the display, compensates for the relatively great tolerances of the display and the conventional tolerances for plastics, without additional space requirements. The metal frame compresses the conducting rubber, and thereby assures a good contact and prevents even the smallest displacemnts of the parts with respect to each other. Other features which are considered as characteristic for the invention are set forth in the appended claims.

Although the invention is illustrated and described herein as embodied in an electronic device with densely packed components, it is nevertheless not intended to be limited to the details shown, since various modifications and structural changes may be made therin without departing from the spririt of the inventionn and within the scope and range of equivalents of the claims.

The construction and method of operation of the invention, however, together with additional objects and advantages thereof will be best understood from the following description of specific embodiments when read in connection with the accompanying drawings, in which:

FIG. 6 is a fragmentary, exploded, perspective view of the housing half shown in FIG. 1, rotated through 180°, including portions of the device shown in FIG. 4.

Figure 1:
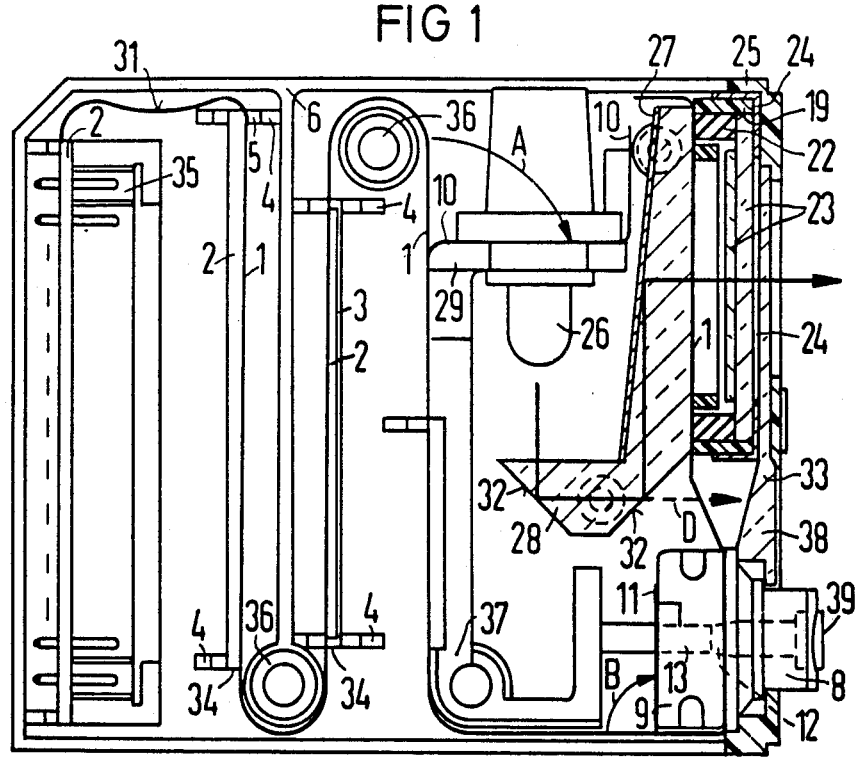
FIG. 1 is a partially cross-sectional view of a housing half constructed according to the invention.
Figure 2:
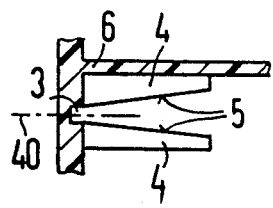
FIG. 2 is a cross-sectional view of a cutout of the housing with a guide groove and insertion ribs.
Figure 3:
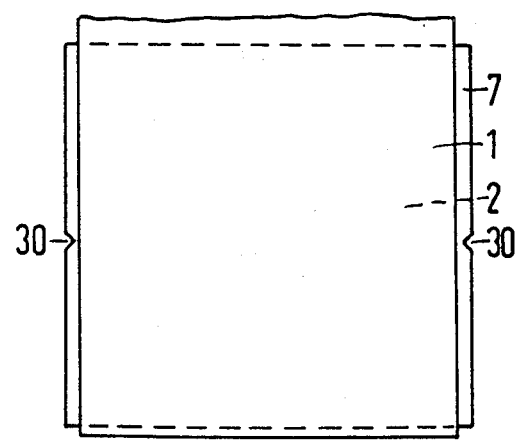
FIG. 3 is a fragmentary, side elevational view of a foil or film circuit according to the invention, with a reinforcement plate.

Referring now to the figures of the drawings in detail, and first particularly to FIGS. 1 through 3 thereof, there is seen a foil or film circuit 1 disposed in a housing half 6 and reinforced with reinforcement plates 2 along portions of the length thereof. The reinforcement plates 2 extend laterally beyond the film circuit 1 and are guided in guide slots 3. FIG. 2 is an enlarged view showing the formation of a slot in the wall of the housing half 6 before reinforcement plate 2 is inserted. Insertion ribs 4 facilitate insertion of the reinforcement plates with the film circuit 1 into the guide slots 3. The insertion ribs 4 have guide surfaces 5 which are speced increasingly further apart from a plane of symmetry 40 of the guide slots 3, with increasing distance from the edges of the guide slots 3, as shown in FIG. 2. The guide slots 3 and the insertion ribs 4 may be molded with the housing half, so that they are made in one piece with the housing half.

The guide slots 3 are provided with end surfaces 34 which simultaneously permit the slots to function as holding elements, when they are in contact with the ends of the edges of the respective reinforcement plates. If a certain mobility in the longitudinal direction is desired for the reinforcement plates, such as in order to compensate changes in length due to temperature variations, it is advantageous to space the end surfaces of the guide slot further apart, corresponding to the length of an edge 7 of the reinforcement plates 2. The edge 7 which is inserted in the slot 3 has notches 30 formed therein, as seen in FIG. 3.

The guidance and holding members for the film circuit 1 will now be discussed. A connector 35 having external connections for the device is connected with a reinforcement plate 2, which is disposed in a guide slot that is also suitable as a holding element. The film circuit 1 is guided in the form of a compensation fold 31 to the next reinforcement plate 2, which is also held in a guide slot 3 that is capable of serving as a holding element. The film circuit 1 runs from there around a stationary pin 36 to another reinforcement plate 2, which is retained in a guide slot 3 that does not serve as a holding element. The film circuit 1 then runs over a second stationary pin 36 to a strap or flap 10 of the film circuit 1, which is folded out from the film circuit in the direction A, and serves for the connection of a lamp 26. The strap 10 is clamped between the lamp contacts and a lamp holder 29, the lamp holder 29 being formed in one piece with the housing half 6. Thus, the lamp holder serves as another holding element for the film circuit 1. The film circuit 1 is then guided along a support surface 37 to a calibration potentiometer 9, which contacts the film circuit by means of folding out a flap or strap 11 of the film circuit in the direction of the arrow B.

Figure 4:
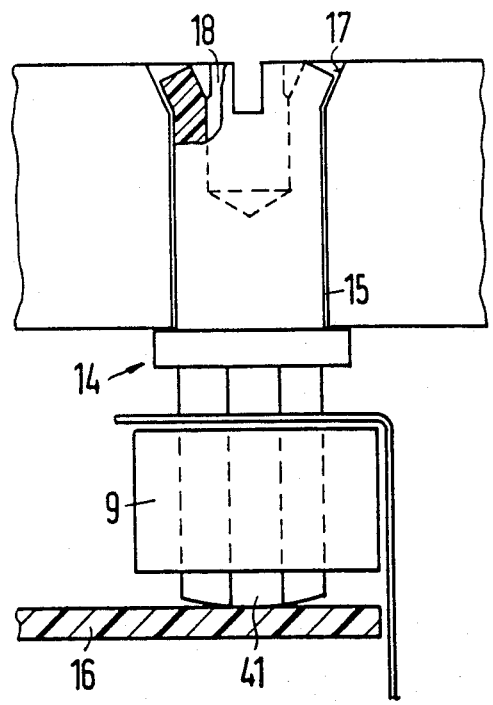
FIG. 4 is a fragmentary, partially cross-sectional view of an adjustment shaft according to the invention.

FIG. 4 is an enlarged view of an adjustment device to be located at the lower right corner of the housing of FIG. 1. The calibration potentiometer 9 is disposed behind an operating key or button 8.

The calibration potentiometer 9 may be provided with a cross slot, in which a cross-shaped portion 41 of a adjustment shaft 14 is engaged. In FIG. 4, for example, all of the potentiometer connections are located at one side of the calibration potentiometer, so that a separate connection for the potentiometer is not required. Instead of the adjustment shaft 14, an adjustment element 13 can be provided as seen in FIG. 1, for setting the calibration potentiometer 9 through a hole 12 formed in the operating key 8. The adjustment element 13 may be a through slot formed in the potentiometer, in which the shaft 14 is disposed, as seen in FIG. 4.

After the calibration potentiometer 9, the film circuit 1 is disposed along a light outlet surface of a light or photo-conductor 28, and makes contact with conducting rubber strips 22, which serve as current supply means for a display 23. The display or display indicator 23 is formed of two transparent layers, and is fastened to the photo-conductor 28 by a metal frame 24. In this way, the conducting rubber strips 22 are compressed, so that a reliable contact and a fixed and stable mechanical connection is formed between the photo-conductor 28, the film circuit 1, the conducting rubber strips 22 and the display 23. In vicinity of the display 23, a window is cut out of the film circuit 1, which permits the transmission of light from the photo-conductor 28. In order to still retain sufficient strength of the film circuit 1, the film circuit is extended, as in vicinity of the strap 10, beyond the part thereof required for electrical functioning and has no cutout in the elongated end region.

Figure 5:
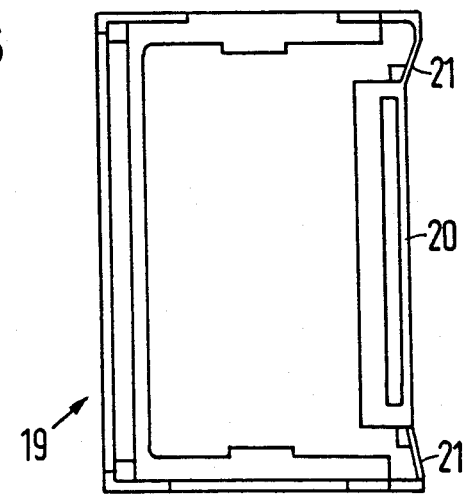
FIG. 5 is a side elevational view of a holding frame with an elastic holding ledge.

A holding frame 19 shown in detail in FIG. 5, serves for holding the conducting rubber strip 22. The holding frame 19 is provided with spring straps 21, which elastically spring load a holding ledge 20, so that the ledge is under pressure. This permits compensation for tolerances in the dimensions of the display 23, without requiring additional space. The holding frame 19 can be economically produced as a simple plastic part. The holding frame fixes the position of the conducting rubber strips, the display 23, the film circuit 1 and the light or photo-conductor 28 with respect to each other.

A viewing mask 25 is provided on the outside of the housing. A window 38 which is provided in the mask 25, on one hand protects the display 23, and on the other hand extends over indicator fields or displays 33 which are illuminated by radiation which comes from a reflecting surface 32 of the photo-conductor 28. This is because due to the spatial location of the lamp 26, light is not reflected toward a strongly reflecting surface of a cover 27. In this manner, all of the surfaces at the front of the device which are to be illuminated, are uniformly lighted by a single light or photo-conductor. Arrows in FIGS. 1 and 6 illustrate how light travels from the lamp 26 and is emitted from the window 38 and the viewing mask 25.

The calibration potentiometer 9 is operated through the hole 12 formed in the operating key 8. In particular, the calibration potentiometer 9 functions by calibrating the fuel gauge measurement for a gasoline tank. After the calibration, the calibration potentiometer 9 is no longer used. For this reason, a bearing box 15 is provided. The bearing box has two parts each being molded into a respective part of the housing 6. As shown in FIG. 4, a recess 17 is provided in the bearing box 15 for the adjustment shaft 14, the recess adjoining the bearing box. The adjustment shaft 14 is made of a thermoplastic synthetic material, which melts at approximately 100° C. The shaft 14 is provided with a depression 18, may be in the form of a blind hole. After the calibration has been performed, the wall in vicinity of the depression 18 may be heated to the point where it becomes soft, for example by a pointed soldering iron, and it may then be pressed into the recess 17. This prevents the adjustment shaft 14 from changing its rotational position. For example, even the remaining gap between the two molded parts of the bearing box 15 may be utilized as the recess 17.

A support wall 16 which is seen in FIG. 4 serves two purposes, on one hand it limits the motion and range of movement of the calibration potentiometer 9, and on the other hand, it acts as a stop for the adjustment shaft 14. It is advisable to extend the wall 16 beyond the axis of symmetry of the adjustment shaft 14. After the calibration, a plug 39 is inserted into the hole 12, and projects beyond the surface of the operating key 8. This makes it possible to locate the operating button by touch even in the dark. The plug 39 may be made of a suitable material, such as plastic or rubber.

| TABULATION OF REFERENCE NUMERALS | |
|---|---|
| 1 Film circuit | 21 Spring strap |
| 2 Reinforcement plate | 22 Conducting rubber strip |
| 3 Guide slot | 23 Display |
| 4 Insertion rib | 24 Metal frame |
| 5 Guide surface | 25 Viewing mask |
| 6 Housing | 26 Lamp |
| 7 Edge of reinforcement plate | 27 Cover |
| 8 Operating key | 28 Light conductor |
| 9 Calibration Potentiometer | 29 Lamp holder |
| 10 Strap | 30 Notch |
| 11 Strap | 31 Compensation fold |
| 12 Hole | 32 Reflecting surface |
| 13 Adjustment element | 33 Indicator field |
| 14 Adjustment shaft | 34 End surface of guide slot |
| 15 Bearing box | 35 Connector |
| 16 Support Wall | 36 Stationary pin |
| 17 Recess | 37 Support surface |

-continued

TABULATION OF REFERENCE NUMERALS

| 18 | Depression | 38 | Window |
|----|------------|----|--------|
| 19 | Holding frame | 39 | Plug |
| 20 | Holding ledge | 40 | Plane of symmetry |
| | | 41 | Cross-shaped part of adjustment shaft 14 |

We claim:

1. Electronic device with densely packed components, comprising a bipartite housing, a film circuit guided meander-like in said housing, at least one reinforcement plate for reinforcing said film circuit over part of the length of said film circuit, means integral with at least one part of said housing for fixing said reinforcement plate in position, an illuminated display disposed in said housing, a calibration potentiometer disposed in said housing for contacting said film circuit, a light conductor disposed in said housing with a light outlet surface disposed behind said display as seen from outside the device, said light conductor having bordering surfaces inclined relative to each other in vicinity of said display, and said light conductor having another bordering surface extended parallel to said display, a lamp disposed on said housing behind said light conductor, as seen from said display and an opaque covering disposed on the side of said light conductor facing said lamp, said covering having a strongly reflective surface facing toward said light conductor, and said light conductor having a light entry surface with a light inlet formed therein substantially perpendicular to said display, and said light conductor having two reflective surfaces disposed along said bordering surfaces at an angle relative to said light entry surface for reflecting a portion of light emitted from said lamp onto said strongly reflective surface of said covering.

2. Electronic device according to claim 1, wherein said fixing means are guides for said reinforcement plates.

3. Electronic device according to claim 1, wherein said fixing means are holders for said reinforcement plates.

4. Electronic device according to claim 2, wherein said guides also hold said reinforcement plates in position.

5. Electronic device according to claim 1, wherein said reinforcement plate has edges extended laterally beyond said film circuit, and said housing has walls with guide slots formed therein forming said fixing means in which said edges of said reinforcement plate are disposed.

6. Electronic device according to claim 5, wherein both parts of said housing have said slots formed therein, defining edges of said slots, and including insertion ribs disposed on said housing walls and projecting from said edges of said slots to ends of said ribs, said ribs having continuous guide surfaces being spaced further apart from each other at said ends of said ribs that at said edges of said slots.

7. Electronic device according to claim 1, wherein said film circuit has flaps formed thereon being folded out for connecting electrical terminals of electrical components disposed outside of said film circuit, to said film circuit.

8. Electronic device according to claim 1, wherein said calibration potentiometer includes an adjustment element for setting said potentiometer and a key disposed toward the outside of said housing for operating said potentiometer, said key having a hole formed therein providing access to said adjustment element.

9. Electronic device according to claim 8, wherein said potentiometer has an adjusting slot formed through said potentiometer forming said adjustment element, and including an adjustment shaft supported in at least one part of said housing and having a shaped part inserted in said adjusting slot, said potentiometer being fixed in position by said adjustment shaft and said film circuit.

10. Electronic device according to claim 8, wherein said film circuit has flaps formed thereon being folded out as contacts, and said potentiometer has an adjusting slot formed through said potentiometer forming said adjustment element, and including an adjustment shaft supported in at least one part of said housing and having a shaped part inserted in said adjusting slot, said potentiometer being fixed in position by said adjustment shaft and one of said flaps of said film circuit.

11. Electronic device according to claim 9, including a bearing box formed of two assembled parts each being molded into a respective part of said housing, said adjustment shaft being disposed in a recess formed in said bearing box in axial direction of said adjustment shaft, and said adjustment shaft having a depression formed therein coaxial to said recess and open to the outside of said housing, said shaft having walls being pressed into said recess in vicinity of said depression for locking in a value set in said potentiometer.

12. Electronic device according to claim 10, including a bearing box formed of two assembled parts each being molded into a respective part of said housing, said adjustment shaft being disposed in a recess formed in said bearing box in axial direction of said adjustment shaft, and said adjustment shaft having a depression formed therein coaxial to said recess and open to the outside of said housing, said shaft having walls being pressed into said recess in vicinity of said depression for lockin in a value set in said potentiometer.

13. Electronic device according to claim 1, including conducting rubber strips contacting said display, a holding frame having fixed holding ledges and a resilient holding ledge securing said conducting strips, and a metal frame, said display and a portion of said film circuit for conenction to said display being fastened to said light conductor by said metal frame and being fixed in position by pressure against said conducting rubber strips.

14. Electronic device according to claim 8, including a plug closing said hole and projecting beyond said key.

15. Electronic device according to claim 1, including indicator fields disposed on said housing being illuminated by radiation from said two reflective surfaces of said light conductor, a viewing mask disposed on the outside of said housing, and a window disposed in said viewing mask protecting said display and extending over said indicator fields.

* * * * *